United States Patent
Makinson et al.

(10) Patent No.: US 7,540,766 B2
(45) Date of Patent: Jun. 2, 2009

(54) PRINTED CIRCUIT BOARD CONNECTOR FOR UTILITY METERS

(75) Inventors: David N. Makinson, Seneca, SC (US); Ludlow Philpot, Fairplay, SC (US)

(73) Assignee: Itron, Inc., Liberty Lake, WA (US)

( * ) Notice: Subject to any disclaimer, the term of this patent is extended or adjusted under 35 U.S.C. 154(b) by 17 days.

(21) Appl. No.: 11/818,221

(22) Filed: Jun. 13, 2007

(65) Prior Publication Data

US 2008/0024115 A1   Jan. 31, 2008

Related U.S. Application Data

(60) Provisional application No. 60/813,647, filed on Jun. 14, 2006.

(51) Int. Cl.
   *H01R 33/945* (2006.01)
(52) U.S. Cl. .................................. 439/517; 439/631
(58) Field of Classification Search ................ 439/517, 439/61, 631, 74
   See application file for complete search history.

(56) References Cited

U.S. PATENT DOCUMENTS

| | | | |
|---|---|---|---|
| 2,904,768 A * | 9/1959 | Rasmussen | 439/631 |
| 3,555,497 A * | 1/1971 | Watanabe | 439/857 |
| 3,778,753 A * | 12/1973 | Occhipinti et al. | 439/631 |
| 4,106,841 A * | 8/1978 | Vladic | 439/188 |
| 4,747,790 A * | 5/1988 | Masuda et al. | 439/631 |
| 4,977,368 A | 12/1990 | Munday et al. | |
| 5,001,420 A | 3/1991 | Germer et al. | |
| 5,068,962 A | 12/1991 | Germer et al. | |
| 5,827,084 A | 10/1998 | Biernath | |
| 6,118,269 A * | 9/2000 | Davis | 324/110 |
| 6,275,168 B1 | 8/2001 | Slater et al. | |
| 6,528,986 B2 | 3/2003 | Ballard | |
| 6,765,800 B2 | 7/2004 | Haba et al. | |
| 6,885,185 B1 | 4/2005 | Makinson et al. | |
| 7,184,904 B2 * | 2/2007 | Kagan | 702/62 |

* cited by examiner

*Primary Examiner*—Neil Abrams
(74) *Attorney, Agent, or Firm*—Dority & Manning, P.A.

(57) ABSTRACT

Disclosed are apparatus and methodology for coupling plural, spaced-apart printed circuit boards together within a utility meter. An individual, rigid connector is provided that, in concert with conductive edge traces on selected printed circuit boards, provides power and signal coupling alternatives for various printed circuit boards. The connector also provides added physical support for the printed circuit boards.

31 Claims, 4 Drawing Sheets

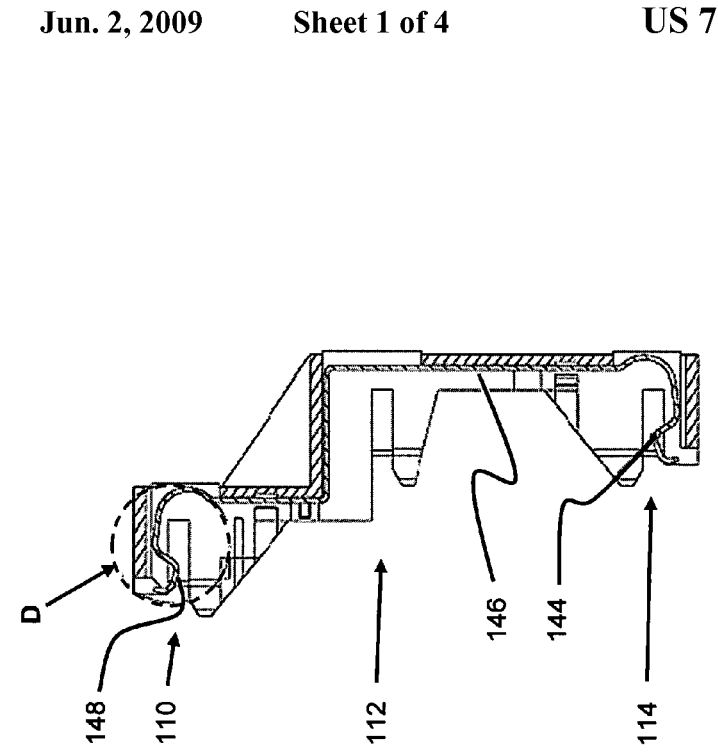
Fig. 1D
Fig. 1C
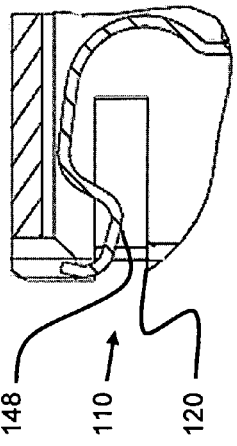
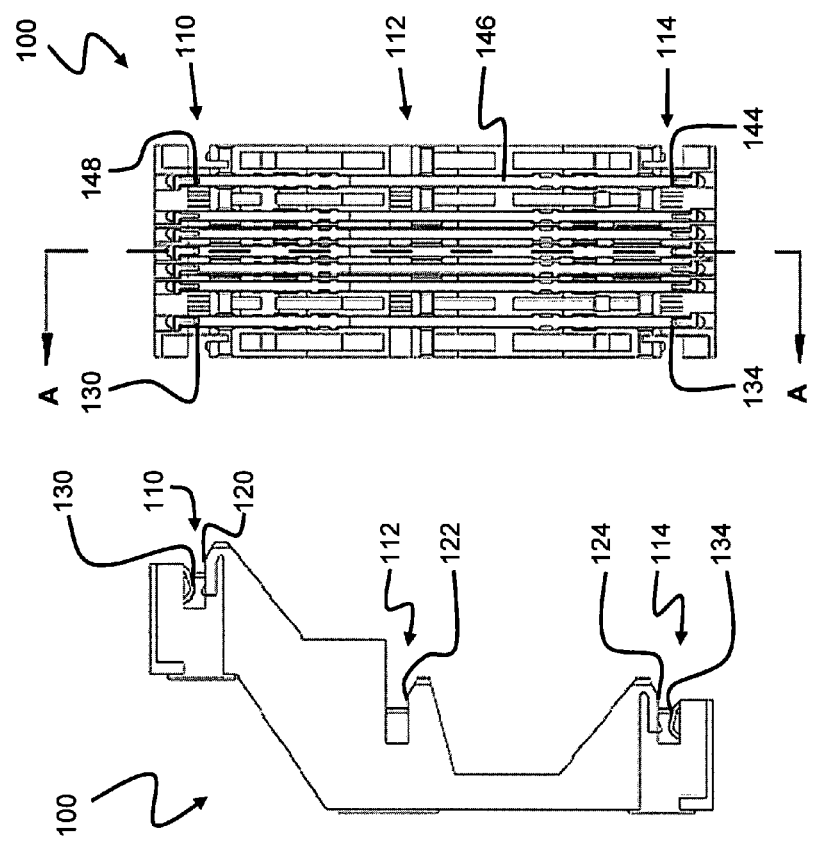
Fig. 1B
Fig. 1A

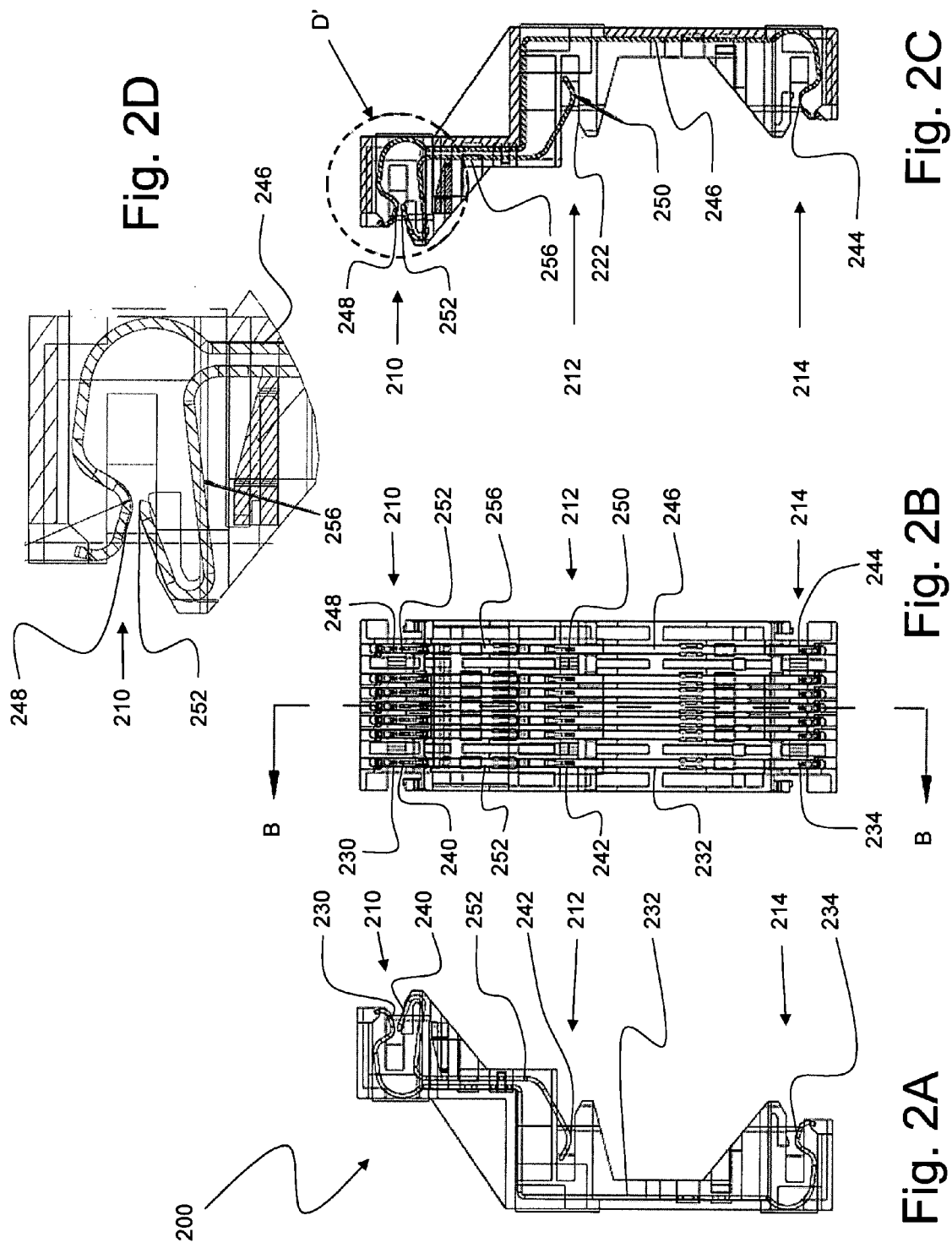

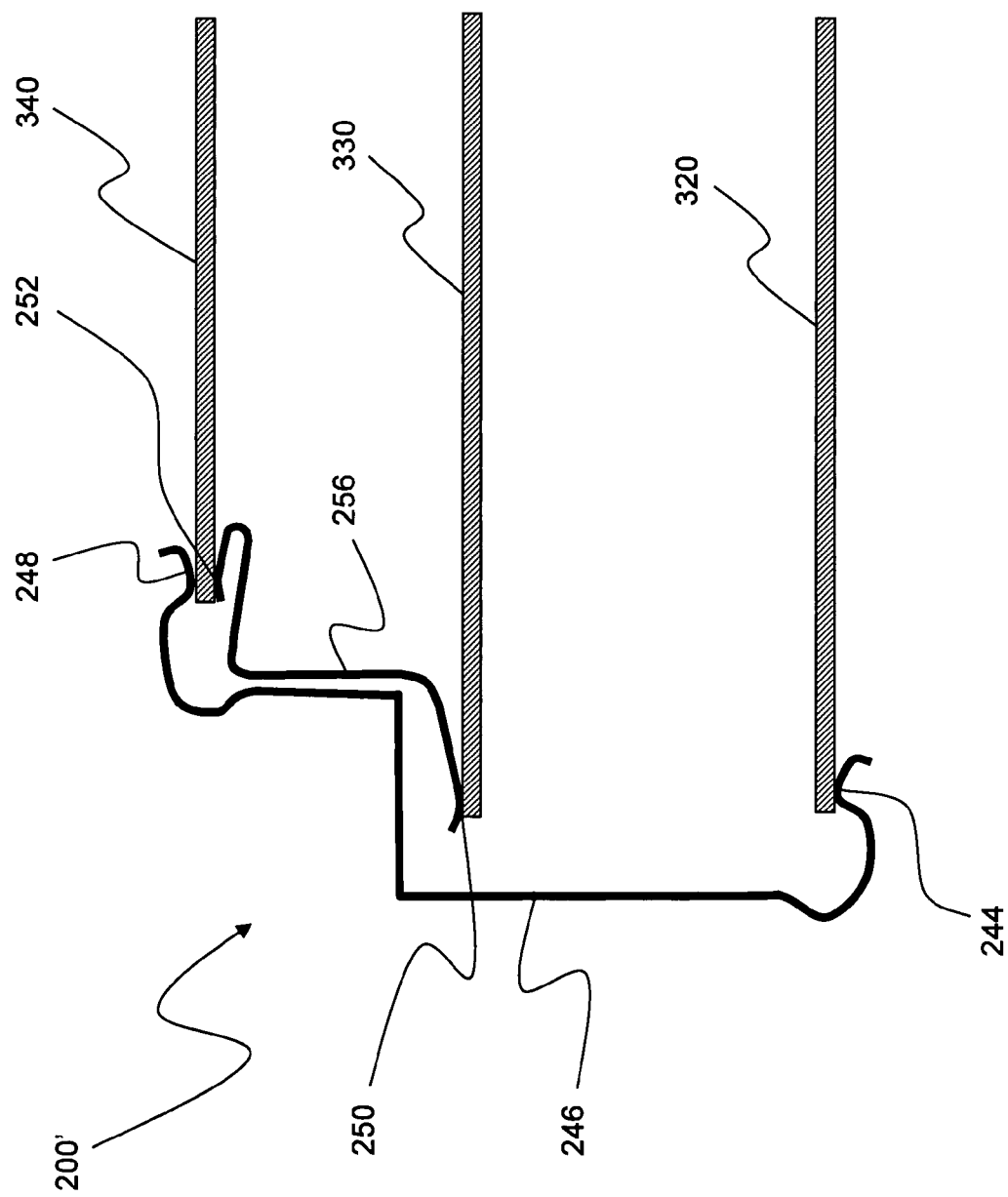

PRINTED CIRCUIT BOARD CONNECTOR FOR UTILITY METERS

PRIORITY CLAIM

This application claims the benefit of previously filed U.S. Provisional Patent Application entitled "PRINTED CIRCUIT BOARD CONNECTOR FOR UTILITY METERS," assigned U.S. Ser. No. 60/813,647, filed Jun. 14, 2006, and which is fully incorporated herein by reference for all purposes. Provisional Patent Application

FIELD OF THE INVENTION

The present technology relates to utility meters. More particularly, the present technology relates to apparatus and methodologies for electrically and physically coupling a plurality of printed circuit boards together within a utility meter.

BACKGROUND OF THE INVENTION

The general object of metrology is to monitor one or more selected physical phenomena to permit a record of monitored events. Such basic purpose of metrology can be applied to a variety of metering devices used in a number of contexts. One broad area of measurement relates, for example, to utility meters. Such role may also specifically include, in such context, the monitoring of the consumption or production of a variety of forms of energy or other commodities, for example, including but not limited to, electricity, water, gas, or oil.

More particularly concerning electricity meters, mechanical forms of registers have been historically used for outputting accumulated electricity consumption data. Such an approach provided a relatively dependable field device, especially for the basic or relatively lower level task of simply monitoring accumulated kilowatt-hour consumption.

The foregoing basic mechanical form of register was typically limited in its mode of output, so that only a very basic or lower level metrology function was achieved. Subsequently, electronic forms of metrology devices began to be introduced, to permit relatively higher levels of monitoring, involving different forms and modes of data.

In the context of electricity meters specifically, for a variety of management and billing purposes, it became desirable to obtain usage data beyond the basic kilowatt-hour consumption readings available with many electricity meters. For example, additional desired data included rate of electricity consumption, or date and time of consumption (so-called "time of use" data). Solid state devices provided on printed circuit boards, for example, utilizing programmable integrated circuit components, have provided effective tools for implementing many of such higher level monitoring functions desired in the electricity meter context.

In addition to the beneficial introduction of electronic forms of metrology, a variety of electronic registers have been introduced with certain advantages. Still further, other forms of data output have been introduced and are beneficial for certain applications, including wired transmissions, data output via radio frequency transmission, pulse output of data, and telephone line connection via such as modems or wireless (such as cellular) linkups.

The advent of such variety and alternatives has often required utility companies to make choices about which technologies to utilize. Such choices have from time to time been made based on both philosophical points or preferences and/ or based on practical points such as, training and familiarity of field personnel with specific designs.

Another aspect of the progression of technology in such area of metrology is that various retrofit arrangements have been instituted. For example, some attempts have been made to provide basic metering devices with selected more advanced features without having to completely change or replace the basic meter in the field. For example, attempts have been made to outfit a basically mechanical metering device with electronic output of data, such as for facilitating radio telemetry linkages.

Another aspect of the electricity meter industry is that utility companies have large-scale requirements, sometimes involving literally hundreds of thousands of individual meter installations, or data points. Implementing incremental changes in technology, such as retrofitting new features into existing equipment, or attempting to implement changes to basic components which make various components not interchangeable with other configurations already in the field, can generate considerable industry problems.

Electricity meters typically include input circuitry for receiving voltage and current signals at the electrical service. Input circuitry of whatever type or specific design for receiving the electrical service current signals is referred to herein generally as current acquisition circuitry, while input circuitry of whatever type or design for receiving the electrical service voltage signals is referred to herein generally as voltage acquisition circuitry.

Electricity meter input circuitry may be provided with capabilities of monitoring one or more phases, depending on whether monitoring is to be provided in a single or multiphase environment. Moreover, it is desirable that selectively configurable circuitry may be provided so as to enable the provision of new or alternative services or processing capabilities within an existing metering device. Such variations in desired monitoring environments or capabilities, however, lead to the requirement that a number of different metrology configurations be devised to accommodate the number of phases required or desired to be monitored, or to provide alternative or additional processing capability within a utility meter.

As such, it is desired to provide a universal metrology technology and associated methodology that permits the selective use of multiple selected metrology blocks in several different environments, including both single and multiphase systems. While various aspects and alternative embodiments may be known in the field of utility metering, no one design has emerged that generally encompasses the above-referenced characteristics and other desirable features associated with utility metering technology as herein presented.

Some examples of electricity meter related patents include U.S. Pat. No. 4,977,368 to Munday, et al. entitled "Electric Utility Meter With Electronic Register"; U.S. Pat. No. 5,001, 420 to Germer, et al., entitled "Modular Construction For Electronic Energy Meter;" U.S. Pat. No. 5,068,962 to Germer, et al. and entitled "Method Of Fabricating An Energy Meter"; U.S. Pat. No. 5,827,084 to Biernath, entitled "Electrical Connector Assembly With Interleaved Multilayer Structure And Fabrication Method"; U.S. Pat. No. 6,275,168 to Slater, et al. and entitled "Expansion Module For Modular Meter"; U.S. Pat. No. 6,528,986 to Ballard, entitled "Inner Component Board Assembly For An electric Utility Meter"; U.S. Pat. No. 6,765,800 to Haba, et al. and entitled "Multiple Channel Modules And Bus Systems Using Same"; and U.S. Pat. No. 6,885,185 Makinson, et al., entitled "Modular meter configuration and methodology."

The disclosures of the foregoing United States patents are, by reference hereto, hereby fully incorporated into this application for all purposes.

While various implementations of metrology devices have been developed, no design has emerged that generally encompasses all of the desired characteristics as hereafter presented in accordance with the subject technology.

SUMMARY OF THE INVENTION

In view of the recognized features encountered in the prior art and addressed by the present subject matter, an improved apparatus and methodology for electrically and physically coupling together multiple printed circuit boards is provided.

In an exemplary configuration, a printed circuit board edge card type connector is provided for coupling signals among a multi-board stacked (i.e. spaced-apart) printed circuit board configuration within the housing of a utility meter.

In one of its simpler forms, the present technology provides an unsecured printed circuit board edge card type connector that also assists in the providing physical support of the connected printed circuit boards.

Another advantageous aspect of the present subject matter connector and corresponding related methodology is that it may be provided in a number of configurations so as to provide various signal processing capabilities and/or signal paths among a plurality of printed circuit boards in a multi-board stacked printed circuit board configuration within the housing of a utility meter.

In accordance with aspects of certain embodiments of the present subject matter, apparatus and methodologies are provided to effect physical support for multiple stacked printed circuit boards while providing optional signal pass through or optional processing capabilities for the utility meter.

In accordance with certain aspects of other embodiments of the present subject matter, apparatus and methodologies have been developed to provide a rigid, independent, individual connector through which both operating power and metrology signals may be provided to a plurality of stacked printed circuit boards.

In accordance with yet additional aspects of further embodiments of the present subject matter, apparatus and accompanying methodologies have been developed to provide a connector that, in concert with predetermined trace configurations on the individual printed circuit boards, may provide a "pass through" connection of signals and/or circuit board operating power from among a plurality of stacked printed circuit boards and/or may function to allow insertion of functional elements including various forms of signal processing between such a plurality of printed circuit boards by providing alternative signal paths for the various printed circuit boards in the multi-board stack.

According to yet still other aspects of additional embodiments of the present subject matter, apparatus and methodologies have been developed to insure that desired electrical functions are performed by the connector while at the same time the connector, by virtue of its physical connection to the multiple printed circuit boards, provides a measure of additional stability to the physical arrangement of the boards.

One exemplary embodiment of the present subject matter relates to a printed circuit board supporting connector, comprising a housing, a first plurality of electrical conductors, and a first plurality of electrical contacts. Such exemplary housing may preferably define designated first, second, and third portions thereof, each of said designated portions being configured to respectively receive and physically support a printed circuit board in an edge card type configuration. Such first plurality of electrical conductors preferably extend in electrically isolated, parallel alignment in such housing and among predetermined of the designated first, second, and third portions. Such exemplary first plurality of electrical contacts are preferably positioned in predetermined of such designated first, second, and third portions, and electrically coupled to selected of the first plurality of electrical conductors. With such an arrangement, advantageously electrical circuits associated with printed circuit boards supported by selected of such designated first, second, and third portions may be selectively electrically coupled for electrical communications therebetween.

In alternatives of the foregoing arrangement, such an exemplary printed circuit board supporting connector may further include a second plurality of electrical conductors extending in electrically isolated, parallel alignment in such housing and between a predetermined first and second of such designated first, second, and third portions; and may further include a second plurality of electrical contacts positioned in such predetermined first and second portions, and electrically coupled to predetermined of such second plurality of electrical conductors, whereby pairs of electrical contacts corresponding to one of such first plurality of electrical contacts and one of such second plurality of electrical contacts are positioned in selected portions of such predetermined first portion of such housing. In such an arrangement, electrical circuits associated with printed circuit boards supported in such designated third portion of such housing may advantageously be electrically coupled for selective electrical communications with electrical circuits associated with printed circuit boards supported in such designated second portion of such housing by way of electrical circuits associated with printed circuit boards supported in such designated first portion of such housing.

In various alternatives of the foregoing arrangements, all in accordance with the present subject matter, selected of such pairs of electrical contacts may variously be configured as normally spaced apart contacts, normally touching contacts, or as make-before-break contacts. In the foregoing arrangements, such electrical communications may include at least one of digital data signals, analog data signals, power signals, analog sensor generated signals, digital signals derived from any analog signals, processed signals, control signals, and data signals of all types.

Another present exemplary embodiment may relate to a utility meter, comprising a plurality of diverse functionality printed circuit boards; a connector having a plurality of edge card type configuration printed circuit board receiving portions; a first plurality of parallel spaced, electrically isolated contacts selectively positioned in a designated first of such plurality of circuit board receiving portions; a second plurality of parallel spaced, electrically isolated contacts selectively positioned in a designated second of such plurality of circuit board receiving portions; and a plurality of electrical conductors electrically connecting selected of such first plurality of contacts to selected of such second plurality of contacts. In such an exemplary utility meter, such plurality of circuit board receiving portions may be preferably configured to mechanically support at least one of such plurality of printed circuit boards and to electrically couple at least two of such plurality of printed circuit boards for signal transmission therebetween.

In certain present alternative arrangements of the foregoing exemplary utility meter, such connector may have three respective printed circuit board receiving portions corresponding to designated first, second, and third printed circuit board receiving portions. In other alternatives thereof, signal transmissions between at least two of such plurality of printed circuit boards may include at least metering data signals relating to one of the consumption or production of one of a variety of forms of energy or commodities including electricity, water, gas, or oil. Still further, such utility meter may comprise an electronic electricity meter configured either for single phase or multi phase applications.

In yet another present exemplary embodiment, an electronic electricity meter may be provided, preferably comprising a base member with a designated first printed circuit board supported thereon; and a connector including a housing defining designated first, second, and third portions thereof, each of such designated portions being configured to respectively receive and physically support a printed circuit board in an edge card type configuration. Such connector may further preferably have a first plurality of electrical conductors extending in electrically isolated, parallel alignment in such housing thereof and among predetermined of such designated first, second, and third portions, and further have a first plurality of electrical contacts positioned in predetermined of such designated first, second, and third portions, and electrically coupled to selected of such first plurality of electrical conductors, such first printed circuit board of such meter being situated in edge card type configuration in one of such designated portions of said housing.

Still further, such exemplary present electronic electricity meter embodiment may include a designated second printed circuit board supported in edge card type configuration in another of such designated portions of such housing; and a designated third printed circuit board supported in edge card type configuration in a further of such designated portions of such housing. In such an arrangement, electrical circuits associated with such printed circuit boards may be electrically coupled for selective electrical communications among such printed circuit boards, such that at least three physically displaced printed circuit boards are provided with both electrical connection and physical support by way of an unsecured edge card type connector in a multi-board stacked printed circuit board configuration using predetermined trace configurations within such connector for selectively communicating signals among such printed circuit boards.

In various present alternatives of the foregoing exemplary electronic electricity meter, such meter may further comprise a second plurality of electrical conductors extending in electrically isolated, parallel alignment in such housing and between a predetermined first and second of such designated first, second, and third portions; and a second plurality of electrical contacts positioned in such predetermined first and second portions, and electrically coupled to predetermined of such second plurality of electrical conductors, whereby pairs of electrical contacts corresponding to one of such first plurality of electrical contacts and one of such second plurality of electrical contacts are positioned in selected portions of such predetermined first portion of such housing. In such alternative arrangements, electrical circuits associated with a printed circuit board supported in such designated third portion of such housing may be electrically coupled for selective electrical communications with electrical circuits associated with a printed circuit board supported in such designated second portion of such housing by way of electrical circuits associated with a printed circuit board supported in such designated first portion of such housing.

In yet further alternative arrangements of present electronic electricity meter embodiments, such pairs of electrical contacts may be respectively each configured as one of a normally open contact pair, a normally closed contact pair, and a make-before-break contact pair. Also, such electrical communications among such printed circuit boards may include at least one of digital data signals, analog data signals, power signals, analog sensor generated signals, digital signals derived from any analog signals, processed signals, control signals, and data signals of all types. Such meter may optionally be configured for either single phase or multi phase applications.

In other present alternatives of the foregoing electronic electricity meters, such printed circuit boards may respectively comprise a metrology board, an options board, and a communications board; or may comprise a combination of a metrology board, an options board, and a register board. Still further, such printed circuit boards may include communications for external data output from such meter, including at least one of wired transmissions, data output via radio frequency transmission, pulse output of data, telephone line connections via modems, and wireless linkups of all types including cellular. Still further, such printed circuit boards may include active elements which reconfigure communications, including active circuitry or switches which multiplex received and transmitted signals on a given circuit such that the associated circuit is flexibly capable of carrying different signals at different times.

It is to be further understood by those of ordinary skill in the art that the present subject matter equally relates to corresponding present methodology. One present exemplary method relates to a method for electrically and physically coupling diverse functionality printed circuit boards. Such exemplary method may comprise providing a connector having plural edge card type configuration circuit board receiving portions; providing selected of the plural circuit board receiving portions with a first plurality of parallel spaced, electrically isolated contacts; providing selected of the plural circuit board receiving portions with a second plurality of parallel spaced, individually electrically isolated pairs of contacts; and providing a plurality of electrical conductors electrically connecting selected of the first plurality of contacts to selected of the second plurality of contacts, thereby forming selected of pairs of contacts associated with respective selected pairings of the plural circuit board receiving portions. Per such methodology, selected configurations of plural circuit boards may be supported and selectively electrically connected relative to one another.

In alternatives of such exemplary present methodology, forming of selected pairs of contacts may optionally comprise providing selected isolated pairs of normally open contacts, providing selected isolated pairs of normally closed contacts, or providing selected isolated pairs of make-before-break contacts. As still further present alternatives, it is to be understood that providing a connector having plural edge card type configuration circuit board receiving portions may comprise providing a connector having respective designated first, second, and third circuit board receiving portions. Per still further exemplary alternatives, the electrical connections of plural circuit boards relative to one another may include at least one of digital data signals, analog data signals, power signals, analog sensor generated signals, digital signals derived from any analog signals, processed signals, control signals, and data signals of all types. Still further, such electrical connections of plural circuit boards relative to one another may include metering data signals relating to one of the consumption or production of one of a variety of forms of energy or commodities including electricity, water, gas, or oil.

Additional objects and advantages of the present subject matter are set forth in, or will be apparent to, those of ordinary skill in the art from the detailed description herein. Also, it should be further appreciated that modifications and variations to the specifically illustrated, referred and discussed features, elements, and steps hereof may be practiced in various embodiments and uses of the present subject matter without departing from the spirit and scope of the present subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents including combinations of features, parts, or steps or configurations thereof not expressly shown in the figures or stated in the detailed description of such figures. Additional embodiments of the present subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which:

FIG. 1A is a left side view of a first embodiment of an exemplary printed circuit board connector in accordance with the present technology;

FIG. 1B is a front view of the connector embodiment of present FIG. 1A, illustrating exemplary multiple conductive connection points within such exemplary connector;

FIG. 1C is a right side cross-sectional view of the present connector illustrated in FIGS. 1A and 1B, taken along section line A-A of FIG. 1B;

FIG. 1D is a detailed view of an end portion of the present connector illustrated in FIG. 1C;

FIG. 2A is a left side cross-sectional view, and FIG. 2B is a front view, of a second exemplary embodiment of a printed circuit board connector in accordance with the present technology, with the connector left side cross-sectional view of FIG. 2A being taken along section line B-B of FIG. 2B, and with such FIG. 2B illustrating multiple exemplary conductive connection points within such connector of such second exemplary embodiment;

FIG. 2C is a right side cross-sectional view of the exemplary connector illustrated in FIGS. 2A and 2B, taken along section line B-B of FIG. 2B;

FIG. 2D is a detailed view of an end portion of the present connector illustrated in FIG. 2C;

FIG. 5 is a schematic representation of an exemplary one of the sets of conductors within an exemplary printed circuit board connector constructed in accordance with the present technology.

Figure 3:
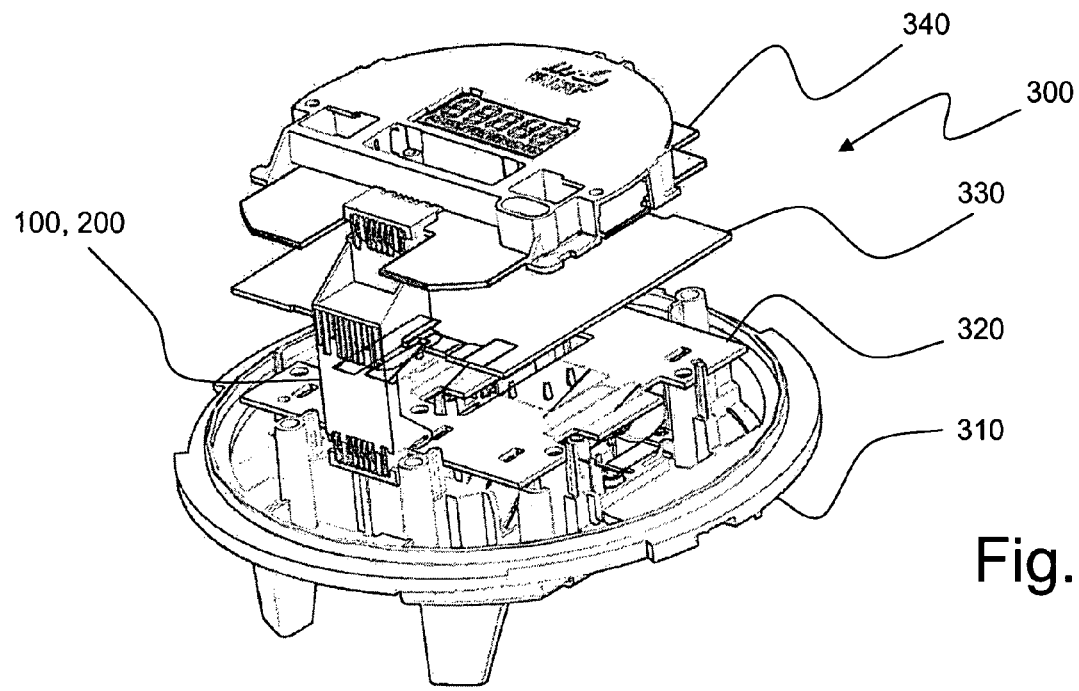
FIG. 3 is a generally top and side isometric view of an exemplary utility meter employing an exemplary printed circuit board connector in accordance with the present technology, to support and to electrically couple a plurality of printed circuit boards together within the meter, as illustrated by present FIG. 3.

Repeat use of reference characters throughout the present specification and appended drawings is intended to represent same or analogous features, elements, or aspects of the present subject matter.

DETAILED DESCRIPTION OF THE PREFERRED EMBODIMENTS

As discussed in the Summary of the Invention section, the present subject matter is particularly concerned with apparatus and methodology for electrically and physically coupling printed circuit boards together in a utility metrology environment.

Respectively selected combinations of aspects of the disclosed technology correspond to a plurality of respective different exemplary embodiments of the present subject matter. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices or features not expressly mentioned which perform the same or similar function.

Moreover, it should be appreciated that, while the general discussion herein relates by way of illustration or example more specifically to electricity meters, such is not a limitation of the present technology. In general, the present technology may be applied to any form of metrology, including, but not limited to, electrical, water, gas, and/or oil metrology. More generally, the present technology may be applied in any general field in which a plurality of printed circuit boards may be provided in a stacked configuration, and in which options for electrical power and/or signal connections and functionality may be desirable, as well as options regarding various physical support considerations.

Reference will now be made in detail to the presently preferred embodiments of the subject printed circuit board connector technology. Referring now to the drawings, FIG. 1A illustrates a left side view of a first embodiment of an exemplary printed circuit board connector 100 constructed in accordance with the present technology. As seen in FIG. 1A, connector 100 may be regarded as a connector having three respective portions, namely, a first portion 110, a second portion 112, and a third portion 114. It is to be understood by those of ordinary skill in the art that the designations first, second, or third with reference to the portion components (or other components) has no substantive meaning relative to the present subject matter. Therefore, different portions may be referred to respectively as either first, second, or third without any difference in the disclosure herewith. Each such respective portion of connector 100 provides a slot area 120, 122, 124, respectively, into which a respective printed circuit board (not illustrated in such figure) may be inserted.

As illustrated at portions 110 and 114 of connector 100, selected portions of selected slots 120, 124 may be provided with exemplary illustrated contacts 130, 134 that may be electrically coupled together along connector 100. Exemplary illustrated contacts 130, 134 cooperate with slots 120, 124 to provide both electrical connections for inserted printed circuit boards as well as physical support for such boards, as will be more fully described below with reference to FIGS. 3 and 4.

With reference now to FIG. 1B, there is illustrated a front view of connector 100, which represents multiple conductive contacts, exemplarily illustrated as contacts 130, 134, 144, 148 and others selectively located within connector 100. In the illustrated exemplary configuration, connector 100 is provided with seven sets of connected contacts physically placed in a parallel configuration. It should be appreciated by those of ordinary skill in the art that any number of connected contact sets may be provided as needed to accommodate the connection requirements of any particular application, and that a precise or specific number of such connected contact sets are not part of the broader aspects of the present subject matter.

As is illustrated and represented with present FIG. 1B, connector 100 corresponds to a plurality of conductors exemplarily illustrated as conductor 146 with corresponding contacts exemplarily illustrated as contacts 144, 148 located in various parallel spaced pathways running along the length of connector 100. Thus, connector 100 is configured to provide a plurality of selectively configurable conductive pathways among the respective three printed circuit boards (not illustrated) which may be inserted into slots 120, 122, 124, for electrical connection and/or physical support.

The various conductive pathways incorporated within connector 100 may be configured to carry both operating power and communications signals among printed circuit boards which may be inserted into slots 120, 122, 124. It should be appreciated by those of ordinary skill in the art that operating power for the printed circuit boards as may be so inserted into slots 120, 122, 124 may correspond to both alternating and/or direct current supplies. In the context of the present disclosure, the term "communications signals" is intended to include both analog and digital signals as may be present in the exemplarily illustrated utility meter, and may include, but certainly are not limited to, analog sensor generated signals, digital signals derived from any analog signals, processed signals, both analog and digital, control signals, and/or data signals of all types.

With reference now to FIG. 1C, there is illustrated a cross-sectional view of connector 100 taken along section line A-A of FIG. 1B. As with FIGS. 1A and 1B, FIG. 1C illustrates first, second and third portions 110, 112, 114, respectively, of connector 100 into which respective printed circuit boards (not shown) may be inserted. More particularly illustrated in FIG. 1C are contact 148 in first portion 110 and contact 144 in third portion 114 of connector 100. In addition, a conductive connection line 146 extends between contacts 144 and 148 to provide electrical continuity there between.

FIG. 1D illustrates in more detail (that is, an enlarged or magnified view) a portion of present exemplary connector 100, which is identified in FIG. 1C with a circular dotted line "D." Corresponding reference numbers of FIG. 1D identify similar elements and features as discussed hereinabove. As may be more clearly seen in FIG. 1D, contact 148 is normally configured to at least partially enter slot 120 such that upon insertion of a printed circuit board in slot 120, electrical contact may be made by contact 148 with a connection trace provided on the printed circuit board, as understood by one of ordinary skill in the art. In addition, physical insertion of the printed circuit board into slot 120 provides mounting support for the printed circuit board, as will be more clearly seen in FIGS. 3 and 4, described below.

With reference now to FIGS. 2A, 2B, 2C, and 2D, there is illustrated a second exemplary embodiment of a printed circuit board connector 200 in accordance with the present technology. Such second exemplary embodiment shares various features with the first exemplary embodiment (connector 100, generally discussed above) but adds to the first set of connected contacts a second set of contacts with connecting conductors.

As with the first exemplary embodiment, the second exemplary embodiment may include a number of sets of connected contacts. In an exemplary configuration, seven sets of connected contacts may be provided, although, as with the first embodiment, the number of such sets utilized in a given embodiment may be more or less, in accordance with the present subject matter, depending on the particular circuit requirements for a given configuration. Moreover, such second sets of connected contacts may or may not match locations with the first set of connected contacts, and may or may not be electrically interconnected with the first sets of connected contacts even if the two sets occupy the same lateral position on the connector. Such relatively more advanced present variations in connection configurations will be more fully explained below with reference to FIG. 5.

With further reference to FIG. 2A, it will be seen that connector 200 is similar to connector 100 previously described in that it is configured in three portions, a first portion 210, a second portion 212, and a third portion 214. First portion 210 provides a first slot (in this view, unnumbered, for the sake of clarity of illustration), in which are located a pair of first contacts 230, 240. Contact 230 is electrically connected, by way of conductor 232, to contact 234 located in the slot at third position 214. Similarly, contact 240, also located in the slot associated with first position 210, is coupled by way of conductor 252 to contact 242 located in the slot associated with position 212. As will be more fully described below with respect to FIG. 5, conductors 232 and 252 may or may not be electrically connected.

With reference to FIG. 2B, it will be seen that connector 200 may correspond to first and second sets of contacts, each set being coupled together and, optionally, selectively electrically coupled to each other. It will also be seen and understood by those of ordinary skill in the art that there may be provided a plurality of generally physically parallel contact and conductor sets. In the exemplary embodiment illustrated in FIG. 2B, seven sets of contacts have been illustrated. It should be well understood by those of ordinary skill in the art that the number of sets of contacts is exemplary only and could be more or less depending on circuit requirements.

With further reference to FIG. 2B, it will be seen that there is illustrated on the left side of FIG. 2B the previously mentioned contact pairs 230, 234 and connecting conductor 232. On the right hand side of FIG. 2B (and also illustrated in FIG. 2C) is a second set of contact pairs 248, 244 and their connecting conductor 246, and there is contact pair 250, 252 and their connecting conductor 256. Also visible in FIG. 2B are five additional sets of pairs of contacts and their respective connecting conductors positioned centrally between the contact and conductor sets on the left and right hand sides of connector 200 (which sides have not been numbered, in order to avoid excess clutter on the figure). It should be appreciated by those of ordinary skill in the art that each of such vertically oriented contact sets constitute independent contact sets. That is, the contact and conductor sets in each vertical parallel pathway along the length of connector 200 (as well as along the length of connector 100) are independent of one another and electrically isolated from each other.

With reference to FIG. 2D, there is illustrated an enlarged detail of the area illustrated in FIG. 2C with circular dotted line area D'. As will be seen from FIG. 2D, contact 248 occupies an upper portion of the slot (unnumbered) associated with first portion 210 of connector 200 while contact 252 occupies a lower portion of such slot.

Figure 4:
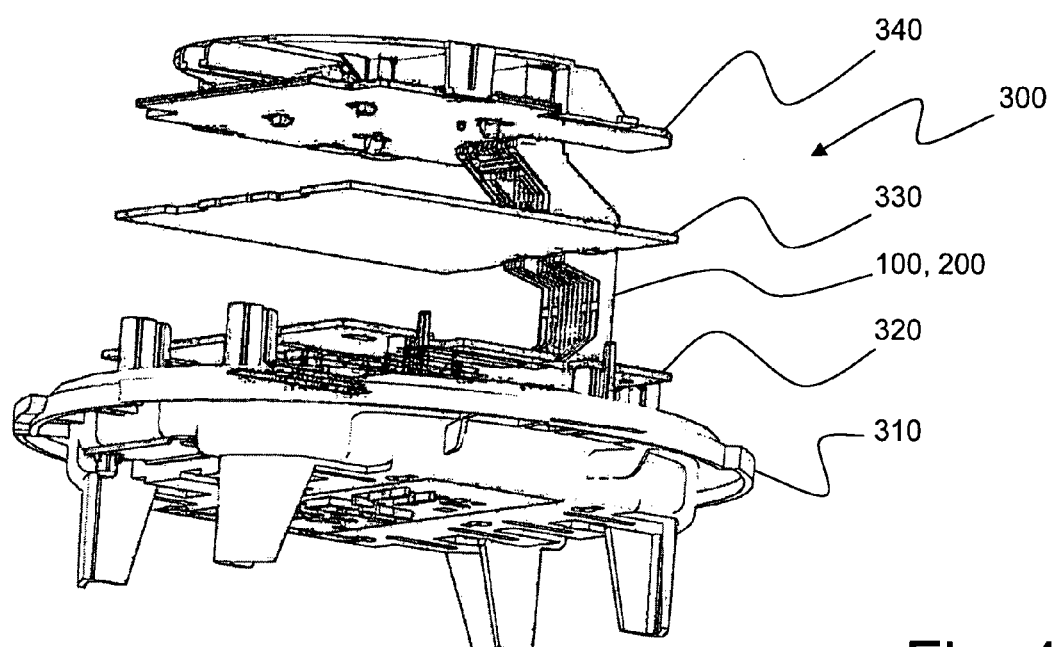
FIG. 4 is a generally side and bottom isometric view of an exemplary utility meter employing an exemplary printed circuit board connector in accordance with the present technology, and illustrating three respective circuit boards so connected in accordance with the present subject matter.

With reference to FIGS. 3 and 4, there are illustrated generally side and top, and side and bottom isometric views of an exemplary utility meter 300 incorporating a connector 100 or 200 in accordance with the present technology. As may be seen from such FIGS. 3 and 4, exemplary utility meter 300 includes a base member 310 to which is attached a first printed circuit board (PCB) 320 that may correspond to, for example, a Metrology Printed Wiring Board (PWB). Connector 100 or 200 as previously described may be attached to connector traces on an edge portion of PCB 320. In a similar manner, an Options Printed Wiring Board corresponding to a PCB 330 may be plugged into a slot of the second portion of the subject connector, as previously described in connector 100 or 200 (whichever may be chosen for use with a particular utility meter selected). Lastly per the subject example, a Register Printed Wiring Board corresponding to PCB 340 may be plugged into a slot of a third portion of present connector 100 or 200.

As previously described, each of the several slot portions of the connector 100 or 200 provide electrical connections and/or support for the PCB plugged into one of the subject slots. The exemplary utility meter, once assembled, may be protected by placement of a cover (such as made of glass or Plexiglas—not shown) over the three PCBs and into sealing engagement with the utility meter base 310.

With reference now to FIG. 5, there is illustrated a schematic representation of an exemplary one of the sets of conductors 200' within an exemplary printed circuit board connector 200 constructed in accordance with the present technology. As may be seen from FIG. 5, contact 248 in a first portion of connector 200 is coupled to contact 244 in a third portion of connector 200 by way of conductor 246. Similarly, contact 252 in the first portion of connector 200 is coupled to contact 250 in a second portion of connector 200 by way of conductor 256. It should be borne in mind that the contact and conductor configuration illustrated in FIG. 5 represents only a single set of possibly plural independent sets of contacts and conductors. As illustrated in FIG. 5, such optional additional sets of contacts and conductors would be in front of and/or behind the illustrated contacts and conductors and in alignment therewith.

A number of variations with respect to the contacts and conductors illustrated in FIG. 5 are possible, all in accordance with the present subject matter. As illustrated, exemplary contact 248 is connected to exemplary contact 244 by way of exemplary conductor 246, and exemplary contact 252 is connected to exemplary contact 250 by way of connector 256. In alternative configurations, connector 246 may be electrically connected to conductor 256. In still further alternative configurations, while contacts 248 and 252 both occupy space in a first slot portion of connector 200, contacts 248 and 252 may be designed such that they remain separated even in the absence of a PCB plugged into the slot. Alternatively contacts 248 and 252 may be designed to touch and thereby make electrical connection there between, even in the absence of an intervening PCB. Yet additional alternatives are possible in that contacts 248 and 252 may be configured as "make-before-break" type contacts.

With further reference to FIG. 5, as previously noted, the single exemplary circuit 200' representation of connector 200 may actually correspond to a plurality of independent circuits, each being like that illustrated in FIG. 5. In an exemplary configuration, connector 200 may include seven such independent circuits. Each of the plurality of circuits may, in cooperation with circuitry associated with the various PCBs, provide different signal paths among the various PCBs.

Conductor 246 serves a traditional Board-to-Board (B2B) function of coupling plural circuits from the Metrology PWB 320 to the Register PWB 340. The addition of a corresponding number of conductors 256, each paired with one of the conductors 246, creates a "B3B" connector 200 in accordance with the present technology.

A feature of this arrangement is that, individually, each of the plurality of circuits can be configured in plural manners, determined primarily by the Register PWB 340 construction. In a first configuration, a signal from the Metrology PWB 320 at contact 244 can pass through conductor 246, to contact 248; pass through via holes in the Register PWB 340 at contact 252, down conductor 256, and to the Option PWB 330 at contact 250 where it may be utilized by the Option PWB 330. In this instance, there may be no circuitry on the Register PWB 340 that utilizes the signal. It could be said that the Register PWB 340, for this circuit, only passes the signal along.

In a second exemplary configuration, a signal from the Metrology PWB 320 at contact 244 can pass up through conductor 246 to contact 248; pass through via holes in the Register PWB 340 at contact 252, down conductor 256, and to the Option PWB 330 at contact 250, where it may be utilized by the Option PWB 330. In addition, there may be one or more traces on the Register PWB 340 that may utilize the signal.

In a third exemplary configuration, a signal from the Metrology PWB 320 at contact 244 can be passed up conductor 246, to contact 248 at Register PWB 340. Such exemplary signal may be utilized by the circuitry of the Register PWB 340. A different signal from the Register PWB 340 may be passed down from contact 252, through conductor 256, and to the Option PWB 330 at contact 250.

A fourth exemplary configuration provides a signal from the Metrology PWB 320 at contact 244 that may be passed up conductor 246, to contact 248, and be utilized by the Register PWB 340. In such configuration, even though conductor 256 remains a part of connector 200, it carriers no signal.

In a fifth exemplary configuration, a signal from the Register PWB 340 at contact 252 can be passed down conductor 256, to contact 250. In such configuration, while conductor 246 remains a part of connector 200, it carries no signal.

It should be appreciated that while the previously discussed signal pathways have been described as a "forward" signal path, such is not a limitation of the present disclosure as the signal path may in fact be reversed or it may in fact be bi-directional. In addition, there could be active circuitry or switches on the Register PWB 340 that multiplexes received and transmitted signals on a given circuit such that the role of the circuit is not fixed, but rather flexible, i.e., capable of carrying different signals at different times. It should be appreciated by those of ordinary skill in the art that if conductors 246 and 256 correspond to a single conductor or electrically coupled conductors as has been previously suggested, certain of the options noted, in particular the third option, will not be available.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure and appended claims is by way of example rather than by way of limitation, and the subject disclosure does not preclude inclusion of such modifications, variations and/or additions to the present subject matter as would be readily apparent to one of ordinary skill in the art.

What is claimed is:

1. A printed circuit board supporting connector, comprising:
a housing defining designated first, second, and third portions thereof, each of said designated portions being configured to respectively receive and physically support a printed circuit board in an edge card type configuration;
a first plurality of electrical conductors extending in electrically isolated, parallel alignment in said housing and among predetermined of said designated first, second, and third portions; and
a first plurality of electrical contacts positioned in predetermined of said designated first, second, and third portions, and electrically coupled to selected of said first plurality of electrical conductors;
whereby electrical circuits associated with printed circuit boards supported by selected of said designated first, second, and third portions may be selectively electrically coupled for electrical communications therebetween; said printed circuit board supporting connector further comprising
a second plurality of electrical conductors extending in electrically isolated, parallel alignment in said housing and between a predetermined first and second of said designated first, second, and third portions; and
a second plurality of electrical contacts positioned in said predetermined first and second portions, and electrically coupled to predetermined of said second plurality of electrical conductors, whereby pairs of electrical contacts corresponding to one of said first plurality of electrical contacts and one of said second plurality of electrical contacts are positioned in selected portions of said predetermined first portion of said housing;
wherein said electrical communications include at least one of digital data signals, analog data signals, power signals, analog sensor generated signals, digital signals derived from any analog signals, processed signals, control signals, and data signals of all types;
whereby electrical circuits associated with printed circuit boards supported in said designated third portion of said housing may be electrically coupled for selective electrical communications with electrical circuits associated with printed circuit boards supported in said designated second portion of said housing by way of electrical circuits associated with printed circuit boards supported in said designated first portion of said housing, for selected combined power and signal couplings among such supported printed circuit boards.

2. A printed circuit board supporting connector as in claim 1, wherein selected of said pairs of electrical contacts are configured as normally spaced apart contacts.

3. A printed circuit board supporting connector as in claim 1, wherein selected of said pairs of electrical contacts are configured as normally touching contacts.

4. A printed circuit board supporting connector as in claim 1, wherein selected of said pairs of electrical contacts are configured as make-before-break contacts.

5. A printed circuit board supporting connector as in claim 1, wherein selected of said first plurality of electrical conductors are electrically coupled to selected of said second plurality of electrical conductors.

6. A method for electrically and physically coupling diverse functionality printed circuit boards, comprising:
providing a connector having plural edge card type configuration circuit board receiving portions including respective designated first, second, and third circuit board receiving portions;
providing selected of the plural circuit board receiving portions with a first plurality of parallel spaced, electrically isolated contacts;
providing selected of the plural circuit board receiving portions with a second plurality of parallel spaced, individually electrically isolated pairs of contacts;
providing a plurality of electrical conductors electrically connecting selected of the first plurality of contacts to selected of the second plurality of contacts, thereby forming selected of pairs of contacts associated with respective selected pairings of the plural circuit board receiving portions, whereby selected configurations of plural circuit boards may be supported and selectively electrically connected relative to one another;
providing portions of the designated first printed circuit board receiving portion with a plurality of parallel spaced, electrically isolated contact pairs;
providing portions of the designated second printed circuit board receiving portion with a plurality of parallel spaced, electrically isolated contacts; and
providing portions of the designated third printed circuit board receiving portion with a plurality of parallel spaced, electrically isolated contacts;
whereby signals may be selectively coupled from the designed third printed circuit board receiving portion to the designed second printed circuit board receiving portion by way of the designated first printed circuit board receiving portion;
wherein the electrical connections of plural circuit boards relative to one another include at least one of digital data signals, analog data signals, power signals, analog sensor generated signals, digital signals derived from any analog signals, processed signals, control signals, and data signals of all types; and
wherein the electrical connections of plural circuit boards relative to one another include metering data signals relating to one of the consumption or production of one of a variety of forms of energy or commodities including electricity, water, gas, or oil.

7. A method as in claim 6, wherein forming selected pairs of contacts comprises providing selected isolated pairs of normally open contacts.

8. A method as in claim 6, wherein forming selected pairs of contacts comprises providing selected isolated pairs of normally closed contacts.

9. A method as in claim 6, wherein forming selected pairs of contacts comprises providing selected isolated pairs of make-before-break contacts.

10. A utility meter, comprising:
a plurality of diverse functionality printed circuit boards;
a connector having a plurality of edge card type configuration printed circuit board receiving portions;
a first plurality of parallel spaced, electrically isolated contacts selectively positioned in a designated first of said plurality of circuit board receiving portions;
a second plurality of parallel spaced, electrically isolated contacts selectively positioned in a designated second of said plurality of circuit board receiving portions; and
a plurality of electrical conductors electrically connecting selected of said first plurality of contacts to selected of said second plurality of contacts;
wherein said plurality of circuit board receiving portions are configured to mechanically support at least one of said plurality of printed circuit boards and to electrically couple at least two of said plurality of printed circuit boards for signal transmission therebetween.

11. A utility meter as in claim 10, wherein said connector has three respective printed circuit board receiving portions corresponding to designated first, second, and third printed circuit board receiving portions.

12. A utility meter as in claim 10, further comprising a third plurality of parallel spaced, electrically isolated contacts selectively positioned in said designated first printed circuit board receiving portion along and configured with said first plurality of parallel spaced, electrically isolated contacts so to form a plurality of contact pairs therewith.

13. A utility meter as in claim 12, wherein said plurality of contact pairs are configured respectively as normally open contact pairs.

14. A utility meter as in claim 12, wherein said plurality of contact pairs are configured respectively as normally closed contact pairs.

15. A utility meter as in claim 12, wherein said plurality of contact pairs are configured respectively as make-before-break contact pairs.

16. A utility meter as in claim 12, wherein said plurality of contact pairs are respectively each configured as one of a normally open contact pair, a normally closed contact pair, and a make-before-break contact pair.

17. A utility meter as in claim 10, wherein said signal transmissions between said at least two of said plurality of printed circuit boards include at least one of digital data signals, analog data signals, power signals, analog sensor generated signals, digital signals derived from any analog signals, processed signals, control signals, and data signals of all types.

18. A utility meter as in claim 17, wherein said signal transmissions between said at least two of said plurality of printed circuit boards include at least metering data signals relating to one of the consumption or production of one of a variety of forms of energy or commodities including electricity, water, gas, or oil.

19. A utility meter as in claim 10, wherein said meter comprises an electronic electricity meter configured for single phase applications.

20. A utility meter as in claim 10, wherein said meter comprises an electronic electricity meter configured for multi phase applications.

21. An electronic electricity meter, comprising:
a base member with a designated first printed circuit board supported thereon;
a connector including a housing defining designated first, second, and third portions thereof, each of said designated portions being configured to respectively receive and physically support a printed circuit board in an edge card type configuration, said connector further having a first plurality of electrical conductors extending in electrically isolated, parallel alignment in said housing thereof and among predetermined of said designated first, second, and third portions, and further having a first plurality of electrical contacts positioned in predetermined of said designated first, second, and third portions, and electrically coupled to selected of said first plurality of electrical conductors, said first printed circuit board of said meter being situated in edge card type configuration in one of said designated portions of said housing;
a designated second printed circuit board supported in edge card type configuration in another of said designated portions of said housing; and
a designated third printed circuit board supported in edge card type configuration in a further of said designated portions of said housing;
whereby electrical circuits associated with said printed circuit boards may be electrically coupled for selective electrical communications among said printed circuit boards, such that at least three physically displaced printed circuit boards are provided with both electrical connection and physical support by way of an unsecured edge card type connector in a multi-board stacked printed circuit board configuration using predetermined trace configurations within said connector for selectively communicating signals among said printed circuit boards.

22. An electronic electricity meter as in claim 21, wherein said connector further comprises:
a second plurality of electrical conductors extending in electrically isolated, parallel alignment in said housing and between a predetermined first and second of said designated first, second, and third portions; and
a second plurality of electrical contacts positioned in said predetermined first and second portions, and electrically coupled to predetermined of said second plurality of electrical conductors, whereby pairs of electrical contacts corresponding to one of said first plurality of electrical contacts and one of said second plurality of electrical contacts are positioned in selected portions of said predetermined first portion of said housing;
whereby electrical circuits associated with a printed circuit board supported in said designated third portion of said housing may be electrically coupled for selective electrical communications with electrical circuits associated with a printed circuit board supported in said designated second portion of said housing by way of electrical circuits associated with a printed circuit board supported in said designated first portion of said housing.

23. An electronic electricity meter as in claim 22, wherein said pairs of electrical contacts are respectively each configured as one of a normally open contact pair, a normally closed contact pair, and a make-before-break contact pair.

24. An electronic electricity meter as in claim 22, wherein selected of said first plurality of electrical conductors are electrically coupled to selected of said second plurality of electrical conductors.

25. An electronic electricity meter as in claim 21, wherein said electrical communications among said printed circuit boards include at least one of digital data signals, analog data signals, power signals, analog sensor generated signals, digital signals derived from any analog signals, processed signals, control signals, and data signals of all types.

26. An electronic electricity meter as in claim 21, wherein said meter is configured for single phase applications.

27. An electronic electricity meter as in claim 21, wherein said meter is configured for multi phase applications.

28. An electronic electricity meter as in claim 21, wherein said printed circuit boards respectively comprise a metrology board, an options board, and a communications board.

29. An electronic electricity meter as in claim 21, wherein said printed circuit boards respectively comprise a metrology board, an options board, and a register board.

30. An electronic electricity meter as in claim 21, wherein said printed circuit boards include communications for external data output from said meter, including at least one of wired transmissions, data output via radio frequency transmission, pulse output of data, telephone line connections via modems, and wireless linkups of all types including cellular.

31. An electronic electricity meter as in claim 21, wherein said printed circuit boards include active elements which reconfigure communications, including active circuitry or switches which multiplex received and transmitted signals on a given circuit such that the associated circuit is flexibly capable of carrying different signals at different times.

* * * * *